United States Patent
Zhang et al.

(10) Patent No.: US 8,488,373 B2
(45) Date of Patent: Jul. 16, 2013

(54) SPIN INJECTION LAYER ROBUSTNESS FOR MICROWAVE ASSISTED MAGNETIC RECORDING

(75) Inventors: Kunliang Zhang, Fremont, CA (US); Min Li, Fremont, CA (US); Yuchen Zhou, San Jose, CA (US); Soichi Oikawa, Hachioji (JP); Hitoshi Iwasaki, Tokyo (JP); Kenichiro Yamada, Tokyo (JP); Katsuhiko Koui, Yokohama (JP)

(73) Assignees: TDK Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 13/200,844

(22) Filed: Oct. 3, 2011

(65) Prior Publication Data

US 2013/0082787 A1     Apr. 4, 2013

(51) Int. Cl.
*G11C 11/00*     (2006.01)

(52) U.S. Cl.
USPC ........ 365/158; 365/171; 365/173; 428/811.1; 257/421; 438/3

(58) Field of Classification Search
USPC ............ 428/811.1; 365/171, 173, 158; 438/3; 257/421
See application file for complete search history.

(56) References Cited

U.S. PATENT DOCUMENTS

| | | | |
|---|---|---|---|
| 7,450,350 B2 | 11/2008 | Carey et al. | |
| 7,593,193 B2 | 9/2009 | Inomata et al. | |
| 8,064,244 B2 * | 11/2011 | Zhang et al. | 365/158 |
| 8,194,361 B2 * | 6/2012 | Kudo et al. | 360/324.11 |
| 8,274,811 B2 * | 9/2012 | Zhang et al. | 365/145 |
| 2009/0225465 A1 | 9/2009 | Iwasaki et al. | |
| 2009/0257151 A1 | 10/2009 | Zhang et al. | |
| 2011/0096443 A1 | 4/2011 | Zhang et al. | |

OTHER PUBLICATIONS

Current-driven excitation of magnetic multilayers, by J.C. Slonczewski, Journal of Magnetism and Magnetic Materials 159(1996) L1-L7, Elsevier.
"Microwave Assisted Magnetic Recording," by Jian-Gang Zhu et al., IEEE Transactions on Magnetics, vol. 44, No. 1, Jan. 2008, pp. 125-131.

* cited by examiner

*Primary Examiner* — Arnold Kinkead
(74) *Attorney, Agent, or Firm* — Saile Ackerman LLC; Stephen B. Ackerman

(57) ABSTRACT

A spin transfer (torque) oscillator (STO) with a non-magnetic spacer formed between a spin injection layer (SIL) and a field generation layer (FGL), and with an interfacial layer comprised of $Fe_{(100-v)}Co_v$ where v is from 5 to 100 atomic % formed between the SIL and non-magnetic spacer is disclosed. A composite seed layer made of Ta and a metal layer having a fcc(111) or hcp(001) texture is used to enhance perpendicular magnetic anisotropy (PMA) in the STO device. The interfacial layer quenches SIL oscillations and thereby stabilizes the SIL against FGL oscillations. The interfacial layer preferably has a thickness from 5 to 50 Angstroms and enhances amplitude (dR/R) in the STO device. The STO device may have a top SIL or bottom SIL configuration. The SIL is typically a laminated structure such as $(Co/Ni)_x$ where x is between 5 and 50.

23 Claims, 4 Drawing Sheets

SPIN INJECTION LAYER ROBUSTNESS FOR MICROWAVE ASSISTED MAGNETIC RECORDING

RELATED PATENT APPLICATION

This application is related to the following: U.S. patent application Ser. No. 12/456,621, filing date Jun. 19, 2009; assigned to the same assignee and herein incorporated by reference in its entirety.

FIELD OF THE INVENTION

The invention relates to a high performance spin valve in which a FeCo interfacial layer is inserted between a spacer and a spin injection layer (SIL) made of $(Co/Ni)_X$ multi-layer structures having high perpendicular magnetic anisotropy (PMA) to help quench SIL oscillations and thereby improve SIL robustness against field generation layer (FGL) oscillations in microwave assisted magnetic recording (MAMR).

BACKGROUND OF THE INVENTION

Spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. Recently, J-G. Zhu et al. described another spintronic device called a spin transfer oscillator in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

Materials with PMA are of particular importance for magnetic and magnetic-optic recording applications. Spintronic devices with perpendicular magnetic anisotropy have an advantage over Magnetoresistive Random Access Memory (MRAM) devices based on in-plane anisotropy in that they can satisfy the thermal stability requirement but also have no limit of cell aspect ratio. As a result, spin valve structures based on PMA are capable of scaling for higher packing density which is a key challenge for future recording devices.

PMA materials have been considered for MAMR applications as described by J-G. Zhu et al. in "Microwave Assisted Magnetic Recording", IEEE Trans. on Magn., Vol. 44, No. 1, pp. 125-131 (2008). A mechanism is proposed for recording at a head field significantly below the medium coercivity in a perpendicular recording geometry. FIG. 1 is taken from the aforementioned reference and shows an ac field assisted perpendicular head design. The upper caption 19 represents a perpendicular spin torque driven oscillator for generating a localized ac field in a microwave frequency regime and includes a bottom electrode 11a, top electrode 11b, perpendicular magnetized reference layer 12 (spin injection layer or SIL), metallic spacer 13, and oscillating stack 14. Oscillator stack 14 is made of a field generation layer (FGL) 14a and a layer with perpendicular anisotropy 14b having an easy axis 14c. The ac field generator in the upper caption 19 is rotated 90 degrees with respect to the lower part of the drawing where the device is positioned between a write pole 17 and a trailing shield 18. The writer moves across the surface of a magnetic media 16 that has a soft underlayer 15. The reference layer 12 provides for spin polarization of injected current (I). Layers 14a, 14b are ferromagnetically exchanged coupled. Improved materials for the SIL and FGL are needed as this technology matures. In particular, it is highly desirable to design a system whereby the spin injection layer (SIL) is stabilized with respect to oscillations in an adjacent field generation layer. The SIL serves as a reference layer which requires a stable magnetization direction while the FGL is free to oscillate between different magnetic orientations.

U.S. Patent Application 2009/0225465 discloses a FeCo bias layer formed on an opposite side of the SIL with respect to a spacer layer. The bias layer may serve as an electrode and exerts a stabilizing magnetic field on the SIL.

U.S. Pat. No. 7,593,193 discloses ferromagnetic CoFe and CoFeNi layers in configurations used to increase the magnetoresistive (MR) ratio in spin valve structures.

U.S. Pat. No. 7,450,350 teaches a CoFe/NiFe/CoFe reference layer.

SUMMARY OF THE INVENTION

One objective of the present invention is to provide a spin transfer oscillator (STO) structure in which the spin injection layer (SIL) is stabilized against FGL oscillations in a MAMR device.

A second objective of the present invention is to enable a higher dR/R amplitude (magnetoresistive ratio) in the MAMR device and thereby improve the signal to noise ratio (SNR).

According to one embodiment of the present invention, these objectives are achieved in a bottom SIL structure wherein a stack of layers comprised of a composite seed layer, $[Co(t1)/Ni(t2)]_X$ laminated spin injection layer (SIL) where x is from about 5 to 50, a $[Co_vFe_{(100-v)}]$ interfacial layer where v is from 5 to 100 atomic %, non-magnetic spacer, FGL, and a capping layer are sequentially formed on a substrate. The seed layer preferably has a Ta/M1/M2 or Ta/M1 configuration where M1 is an alloy such as NiCr or a metal having a fcc(111) or (hcp) hexagonal closed packed (001) crystal orientation such as Ru, and M2 is Cu, Ti, Pd, W, Rh, Au, or Ag. In the case of Pd, Au, and Ag, the M2 layer thickness is kept to a minimum in order to reduce cost and/or minimize any spin depolarization effect. The Ta and M1 layers in the composite seed layer are critical for enhancing the (111) texture in overlying layers. In the SIL, each of the Co layers has a thickness (t1) from 0.5 to 5 Angstroms and each of the Ni layers has a thickness (t2) of 2 to 10 Angstroms. The spacer may be Cu in a CPP-GMR configuration or one of AlOx, MgO, TiOx, TiAlOx, MgZnOx, ZnOx, or other metal oxides or nitrides typically employed as insulator layers to provide a CPP-TMR configuration. The capping layer may be Ru/Ta/Ru, for example. Alternatively, the FeCo FGL layer where Fe content is $\geq 50$ atomic % may be replaced by a FeCo layer alloyed with a non-magnetic material such as Al, Cu, Si, Ge, or the like.

The present invention also encompasses a top SIL embodiment in a STO structure wherein a composite seed layer, FGL, non-magnetic spacer, $[Co_vFe_{(100-v)}]$ interfacial layer, laminated $(Co/Ni)_X$ SIL, and a capping layer are sequentially formed on a substrate. The aforementioned layers may be comprised of the same materials as mentioned in the bottom SIL embodiment.

In another aspect, the Cu spacer in the aforementioned CPP-GMR configurations may be modified by inserting a confining current path (CCP) nano-oxide layer (NOL) between upper and lower portions of the Cu spacer. For example, an amorphous oxide such as AlOx with Cu pathways therein may be formed between two copper spacer layers in a Cu/CCP/Cu configuration. In a CCP-CPP scheme, the Cu metal path is limited through an insulator template such as AlOx so that the MR ratio in the spin valve can be enhanced quite significantly.

In all embodiments, the substrate may be a main pole layer, and a write shield may be formed on the capping layer. The spin valve stack may be annealed between 150° C. and 300° C. for a period of 0.5 to 5 hours. Preferably, Co and Ni layers in the $(Co/Ni)_X$ laminate are deposited with very low deposition power and high inert gas pressure to minimize the impinging ion energy so that deposition of a layer does not damage the Co, or Ni layer on which it is formed. Thus, the interfaces between the Co and Ni layers are preserved to maximize the PMA property. Furthermore, this method enables the PMA of $(Co/Ni)_X$ laminates to be preserved with a substantially thinner seed layer.

DETAILED DESCRIPTION OF THE INVENTION

The present invention is a STO structure having a CPP spin valve configuration that includes a $(Co/Ni)_X$ laminated spin injection layer (SIL) with perpendicular magnetic anisotropy which is stabilized with respect to field generation layer oscillations by inserting an interfacial layer between the SIL and a non-magnetic spacer. PMA amplitude in the SIL is also enhanced. The terms "field" and "flux" may be used interchangeably when describing FGL components of a MAMR device. Although the exemplary embodiment refers to a STO formed between two electrodes represented by a main pole layer and a trailing shield, the STO described herein encompasses other configurations that include an electrode other than a main pole layer or trailing shield. Atomic % of an element A in an alloy AB, for example, is defined as the ratio of the number of atoms of element A / the total number of atoms in the alloy.

In related patent application Ser. No. 12/456,621, we disclosed the advantages of Co/Ni multilayer structures having PMA in. MRAM applications where the magnetic anisotropy of a $(Co/Ni)_X$ laminated structure arises from the spin-orbit interactions of the 3d and 4s electrons of Co and Ni atoms. Such interaction causes the existence of an orbital moment which is anisotropic with respect to the crystal axes which are in (111) alignment, and also leads to an alignment of the spin moment with the orbital moment. PMA in $(Co/Ni)_X$ laminates and the like is enhanced with a thin seed layer having a fcc(111) or hcp(001) crystal orientation. Here we disclose additional STO configurations whereby a SIL may be stabilized in the presence of FGL oscillations while simultaneously increasing the magnetoresistive ratio (MR) in the MAMR device.

Figure 1:
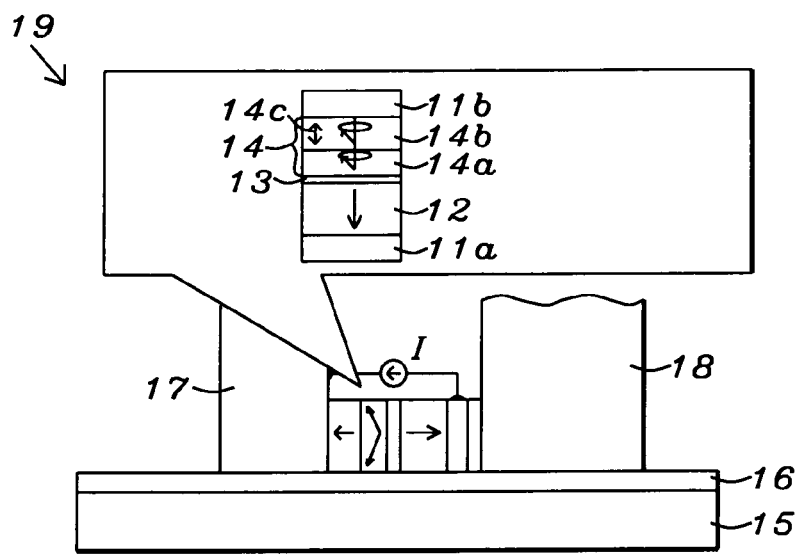
FIG. 1 is a schematic illustration of a MAMR recording head with an ac field assisted perpendicular head design according to a prior art reference.
Figures 2A, 2B:
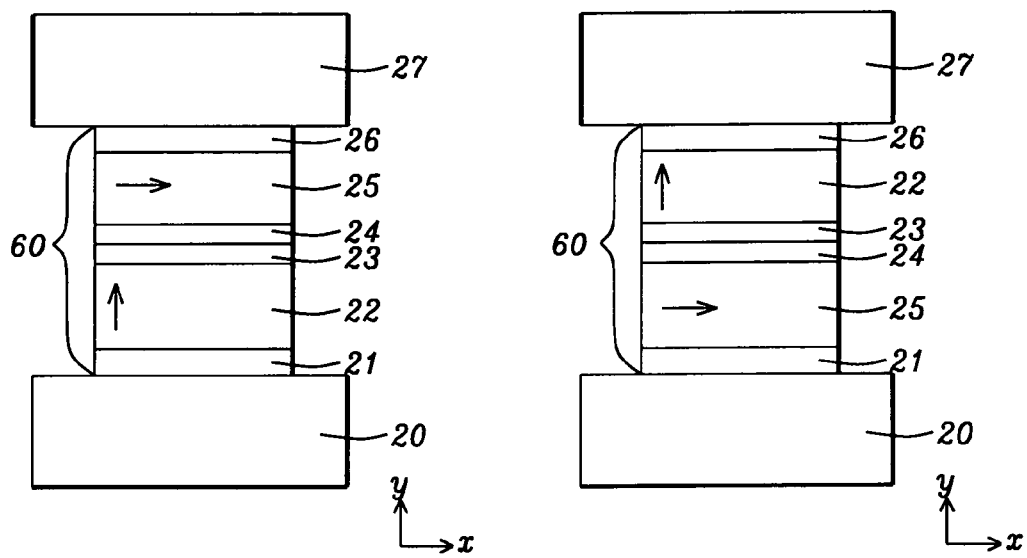
FIG. 2a shows a MAMR structure with a bottom SIL configuration where the FGL has a horizontal anisotropy and the SIL has PMA according to one embodiment of the present invention.
FIG. 2b shows a MAMR structure with a top SIL configuration where the FGL has a horizontal anisotropy and the SIL has PMA according to a second embodiment of the present invention.

Referring to FIG. 2a, a cross-sectional view of a bottom SIL configuration in a MAMR device according to a first embodiment of the present invention is shown. Substrate 20 may be a main pole layer comprised of FeCo, NiFe, or CoFeNi, for example. The spin valve stack of layers 21-26 formed on the substrate is hereafter referred to as a spin transfer (torque) oscillator (STO) 60. There is a composite seed layer 21 with a fcc(111) lattice formed on the substrate and comprised of a Ta/Ru/Cu configuration where a lower Ta layer having a thickness of 5 to 100 Angstroms contacts the substrate 20, a middle Ru layer about 10 to 100 Angstroms thick is formed on the Ta layer, and an upper Cu layer 1 to 100 Angstroms thick is formed on the Ru layer. In another aspect, the upper Cu layer may be removed and a Ta/Ru composite seed layer 21 is employed wherein the Ta and Ru layers have thicknesses of 5 to 100 Angstroms, and 10 to 100 Angstroms, respectively. Optionally, Ru may be replaced by a metal M1 layer having a fcc(111) or hcp(001) lattice structure such as Cu, NiCr, NiFeCr, or Ti. For example, the composite seed layer 21 may have a Ta/Cu or Ta/NiCr configuration where Ta thickness is from 5 to 50 Angstroms, Cu thickness is between 20 and 50 Angstroms, and NiCr thickness is from 40 to 100 Angstroms.

In another embodiment, the upper Cu layer in the trilayer seed layer 21 configuration may be replaced by a metal M2 such as Ti, Pd, W, Rh, Au, Ag, or the like with a thickness for M2 of from 1 to 100 Angstroms to give a Ta/M1/M2 configuration where M1 is unequal to M2. However, it is critical that the composite seed layer 21 be comprised of a lower Ta layer and at least one metal layer having fcc(111) or hcp(001) crystal orientation on the Ta layer to enhance the (111) crystal structure in other layers in the spin valve thereby enlarging the PMA magnitude in an overlying $(Co/Ni)_X$ laminated SIL 22. In another embodiment, the composite seed layer may comprise NiCr and at least one of Ta and Ru.

Above the composite seed layer 21 is a reference layer or SIL 22 having PMA aligned in a y-axis direction which is the downtrack direction and with a $(Co/Ni)_X$ structure where x is between 5 and 50, and preferably between 10 and 30, depending on the Mst (magnetic saturation×thickness) requirement. Each of the plurality of magnetic Co layers in the laminate has a thickness from 0.5 to 5 Angstroms, and preferably between 1.5 to 3 Angstroms. Each of the plurality of magnetic Ni layers in the SIL has a thickness from 2 to 10 Angstroms, and preferably between 3.5 and 8 Angstroms. The thickness t2 is greater than thickness t1, and preferably, t2~2×t1 in order to optimize the spin orbit interactions between adjacent Co and Ni layers. In addition, Co and Ni layers are deposited by a method that preserves the Co/Ni interfaces as described in a later section. In one aspect, when t1 is less than or equal to about 2 Angstroms, the Co layer may be considered as a "close-packed" layer and not necessarily having a (111) crystal orientation. Note that the maximum PMA is achieved with t1=2 Angstroms and t2=5 Angstroms, and PMA decreases significantly when t1 becomes larger than 4 Angstroms. It is well known in the art that a magnetic layer with high spin polarization such as Co must be at least two monolayers thick to demonstrate a decent spin polarization value. Thus, the spin scattering coefficient in $(Co2/Ni5)_X$ systems is limited and an alternative approach is necessary to realize higher PMA to increase device amplitude.

According to one embodiment, improved device amplitude (MR ratio or improved dR rise for a better spin torque response) is achieved with an insertion layer 23 comprised of FeCo or Co formed between the SIL 22 and a non-magnetic spacer 24 that separates the SIL from FGL 25. Insertion layer 23 preferably is FeCo having a thickness between 5 and 50 Angstroms and a Co content between 5 and 100 atomic %. In particular, the FeCo insertion layer has a large spin scattering effect that helps to quench SIL oscillations and thereby improve SIL stability against FGL oscillations. Preferably, a high Fe content is desired to increase the spin scattering effect. It should be understood that exchange coupling occurs between the SIL 22 and insertion layer 23 such that the insertion layer assumes a partial PMA character.

The non-magnetic spacer 24 may be comprised of Cu in a CPP-GMR configuration, or a dielectric layer such as AlOx, MgO, TiOx, TiAlOx, MgZnOx, ZnOx, or other metal oxides or metal nitrides typically employed as insulator layers to give a CPP-TMR configuration. Preferably, the non-magnetic spacer 24 is sufficiently thick to prevent coupling between the SIL 22 and FGL 25. Moreover, a Cu spacer is selected because of having excellent conductivity to enable a current to pass through the STO layers 21-26 in a current perpendicular to plane (CPP) direction during a read or write process.

FGL 25 is formed on the non-magnetic spacer 24 and preferably has a high spin polarization and a small magnetic damping coefficient in order to enable spin transfer magnetization switching in the spintronic device. FGL is a magnetic (ferromagnetic) layer made of FeCo or an alloy thereof containing at least one atom selected from Al, Ge, Si, Ga, B, C, Se, and Sn and has a large magnetic moment (high Bs) aligned along an easy axis direction that is switched to an opposite direction when a spin torque of sufficient magnitude is applied. In a preferred embodiment, FGL 25 is a FeCo layer with a Fe content $\geq 50$ atomic % and a thickness from 50 to 300 Angstroms. However, the FGL may also be a CoFe layer in which Fe content is <50 atomic %.

The uppermost layer in STO 60 is a composite capping layer 26 that contacts a write shield 27 according to one embodiment of the present invention. In one aspect, the capping layer 26 has a Ru/Ta/Ru configuration where the upper Ru layer is used to provide oxidation resistance and excellent electrical contact to an overlying top electrode (not shown). A substantial reduction in critical current density (Jc) occurs when a thin Ru layer is employed as a capping layer in a STT-MRAM embodiment due to the strong spin scattering effect of Ru. Critical current density (Jc) is preferably about $10^6$ A/cm$^2$ to be viable for spin-transfer magnetization switching in the 90 nm technology node and beyond. Higher values could destroy a thin tunnel barrier made of AlOx, MgO, or the like as employed in a CPP-TMR embodiment of the present invention. The Ta layer may be included to offer etch resistance in subsequent processing steps. Optionally, other capping layer materials used in the art may be employed as capping layer 26.

Referring to FIG. 2b, a top SIL embodiment of the present invention is depicted which comprises the same layers as in FIG. 2a except the SIL 22 and FGL 25 have switched positions in the STO stack. An insertion layer 23 is still formed between non-magnetic spacer 24 and SIL 22 to give a STO 60 configuration represented by seed layer/FGL/non-magnetic spacer/interfacial layer/SIL/capping layer where the seed layer contacts the substrate and the capping layer is the uppermost layer. For a CPP-GMR embodiment, STO 60 may have a Ta/Ru/Cu/FeCo/Cu/[Co(t1)/Ni(t2)]$_X$/Ru/Ta/Ru configuration. Alternatively, the Ta/Ru/Cu seed layer, FeCo FGL, and capping layer may be replaced by other suitable materials as indicated previously for the bottom SIL embodiments. Moreover, the Cu spacer may be replaced by a dielectric layer such as AlOx, MgO, TiOx, TiAlOx, MgZnOx, ZnOx, or other metal oxides or metal nitrides employed as insulator layers to give a CPP-TMR configuration. In one aspect, the substrate 20 may be a main pole layer which functions as a bottom electrode and a write shield 27 may be formed on the capping layer to serve as a top electrode in the spintronic device.

The present invention also anticipates that in a CPP-GMR configuration having either a bottom SIL or top SIL orientation, the Cu spacer may be replaced by a confining current path (CCP) CPP GMR sensor where the current through the Cu spacer is limited by the means of segregating metal path and oxide formation. With a CCP-CPP scheme, the Cu metal path is limited through an insulator template or nano-oxide layer (NOL) so that the MR ratio can be significantly enhanced. An NOL layer (not shown) may be formed by a well known method involving deposition of an AlCu layer on a lower Cu layer followed by a pre-ion treatment (PIT) and an ion-assisted oxidation (IAO) process to convert the AlCu layer into an AlOx matrix having segregated Cu pathways (current confining paths) therein. Thereafter, an upper Cu layer is deposited on the NOL (CCP) layer.

Figure 6:
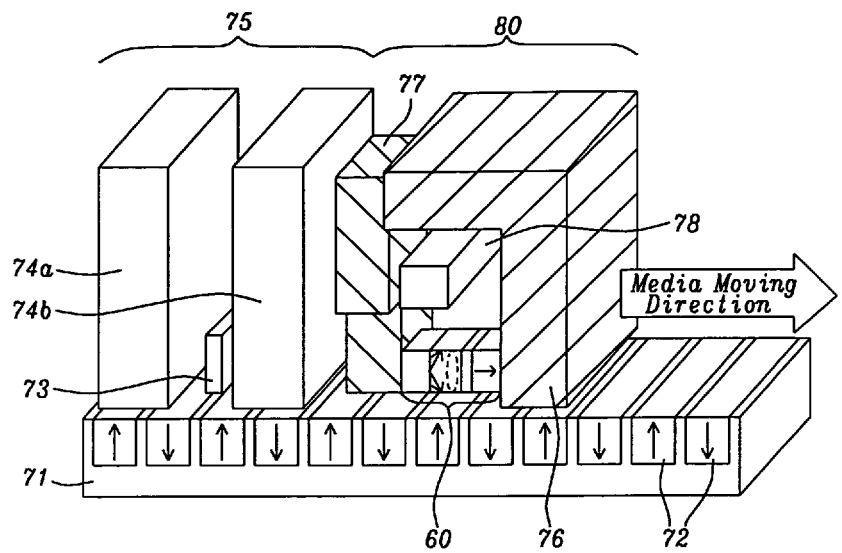
FIG. 6 is a cross-sectional view of a merged read-write head wherein a "top" STO writer comprised of a main pole, write shield, and spin transfer oscillator structure is formed according to an embodiment of the present invention.

Referring to FIG. 6, the MAMR structure or spin transfer oscillator (STO) 60 may be formed in a write head 80. In the exemplary embodiment, the STO writer 80 is pictured as part of a merged read-write head where the read head 70 includes top and bottom shields 74a, 74b, and a sensor 73 between the aforementioned shields. STO writer 80 is comprised of a main pole 76, a trailing shield 77 and a wire (coil) 78 for injecting current into the spin transfer oscillator structure 60 which is shown in a "top FGL/bottom SIL" STO configuration. As mentioned earlier, a bottom SIL configuration preferably has a $(Co/Ni)_X$ laminate as the SIL 22 which is separated from the main pole layer 76 by a seed layer. The $(Co/Ni)_X$ laminate has a PMA aligned in the same direction as the media moving direction. Note that the FGL or oscillator layer in STO 60 is formed closer to the first electrode (trailing shield 77) than the SIL or reference layer and has a magnetization direction which is free to rotate as indicated by the layer with two arrows and a dotted circle indicating the oscillation direction.

Figure 7:
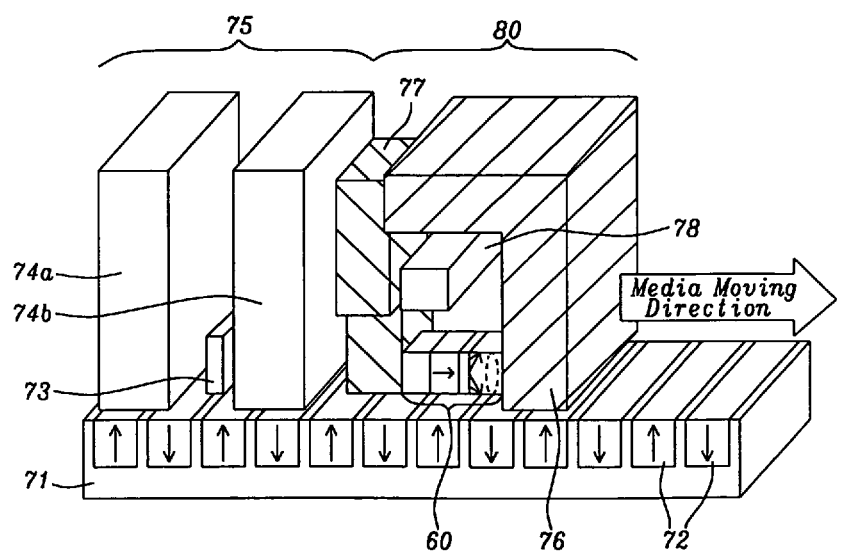
FIG. 7 is a cross-sectional view of a merged read-write head wherein a "bottom" STO writer comprised of a main pole, write shield, and spin transfer oscillator structure is formed according to an embodiment of the present invention.

In an alternative embodiment as depicted in FIG. 7, the positions of the field generation (oscillator) layer and SIL may be switched to give a "bottom FGL/top SIL" STO 60 configuration. In this case, the FGL is separated from the main pole 76 by a seed layer and a capping layer separates the SIL from the trailing shield 77. The merged read-write head moves in the direction indicated while suspended on an air bearing surface above substrate 71 having media tracks 72 formed thereon.

With regard to a process of forming the various spin valve structures of the aforementioned embodiments, all of the layers in the CPP spin valve stack may be laid down in a sputter deposition system. For instance, the CPP stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas with ultra-high vacuum and the targets are made of metal or alloys to be deposited on a substrate. All of the CPP layers may be formed after a single pump down of the sputter system to enhance throughput.

The present invention also encompasses an annealing step after all layers in the CPP spin valve structure have been deposited. The STO 60 may be annealed by applying a temperature between 150° C. and 300° C., and preferably between 180° C. and 250° C. for a period of 0.5 to 5 hours. No applied magnetic field is necessary during the annealing step because PMA is established as a result of the (111) texture in the composite seed layer 21 and due to the Co—Ni spin orbital interactions in the laminated SIL 22. However, the present invention also anticipates that a field may be applied during annealing to further increase PMA in the STO structure.

An important feature of the present invention is the method for depositing a $(Co/Ni)_X$ laminated SIL 22. In particular, low deposition power and high Ar pressure are utilized to avoid damaging the substrate on which each Co or Ni layer is deposited in order to preserve the resulting Co/Ni interfaces and enhance the PMA property therein. In other words, the ion energy impinging on recently deposited Co and Ni surfaces is minimized during sputter deposition of subsequent Co and Ni layers to reduce damage from ion bombardment during the sputtering process. In one embodiment, each of the Co and Ni layers in a laminated SIL 22 is laid down in a DC magnetron sputter deposition chamber by a process comprising a deposition power of less than 200 Watts, and an Ar flow rate of >15 standard cubic centimeters per minute (sccm).

Once all the layers in the STO 60 are formed, the STO is typically patterned into a substantially square or rectangular shape from a top-down perspective by a well known photoresist patterning and reactive ion etch transfer sequence. Thereafter, an insulation layer (not shown) may be deposited on the substrate 20 followed by a planarization step to make the insulation layer coplanar with the capping layer 26. Next, the trailing shield 77 may be formed on the STO 60 and insulation layer as appreciated by those skilled in the art.

Example 1

Figure 3:
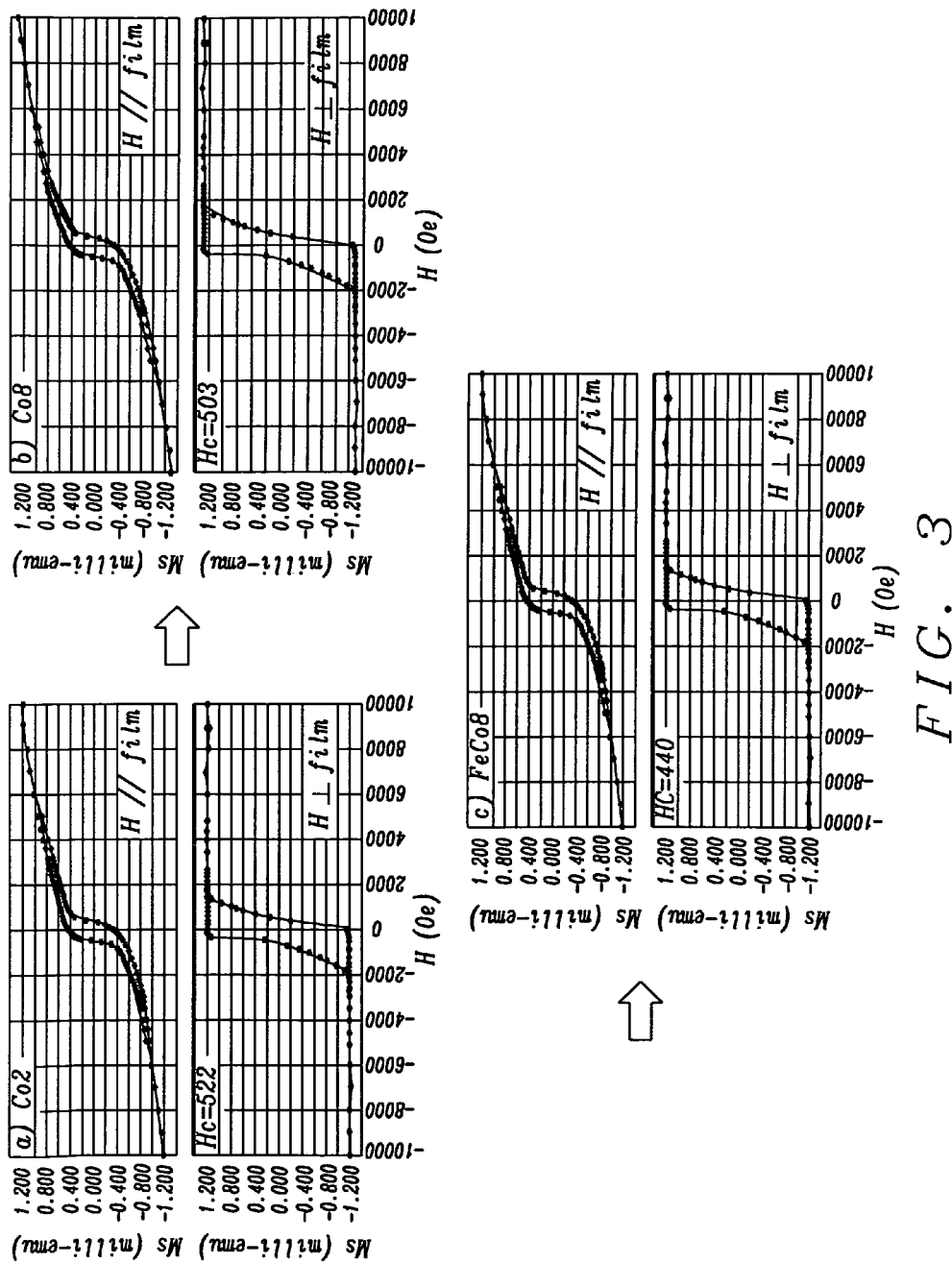
FIG. 3 shows MH curves (parallel and perpendicular components) for a STO structure including different interfacial layers formed between a bottom $(Co/Ni)_X$ laminated SIL and a Cu spacer according to an embodiment of the present invention.

Referring to FIG. 3, a series of STO structures comprising a bottom SIL configuration were fabricated to demonstrate the efficiency of various interfacial layers as examples of the first embodiment. The bottom SIL configuration is represented by Ta10/Ru20/Cu20/[Co2/Ni5]$_{15}$/interfacial layer/Cu30/FeCo100/Ru10/Ta40/Ru30 where the number following each layer is the thickness in Angstroms. Ta/Ru/Cu is employed as the seed layer, Cu is the non-magnetic spacer, FeCo100 is the FGL, and a (Co2/Ni5)$_{15}$ laminate is the SIL in which each Co layer is 2 Angstroms thick and each Ni layer is 5 Angstroms thick and x is 15. The capping layer is a Ru10/Ta40/Ru30 composite. Based on torque measurements, we deduced that Hk for each (Co/Ni)$_{15}$ stack is >15000 Oersted (Oe). The results in graph (a), graph (b), and graph (c) are for a 2 Angstrom thick Co interfacial layer, 8 Angstroms thick Co layer, and an 8 Angstrom thick FeCo layer, respectively. Note that coercivity (Hc) is reduced slightly with the thicker Co and FeCo layers as shown by the smaller Hc value in the lower half (perpendicular component) of each graph. However, an 8 Angstrom thick Co or FeCo interfacial layer is preferred over a thinner Co layer because dR/R is obviously improved.

Example 2

Figure 4:
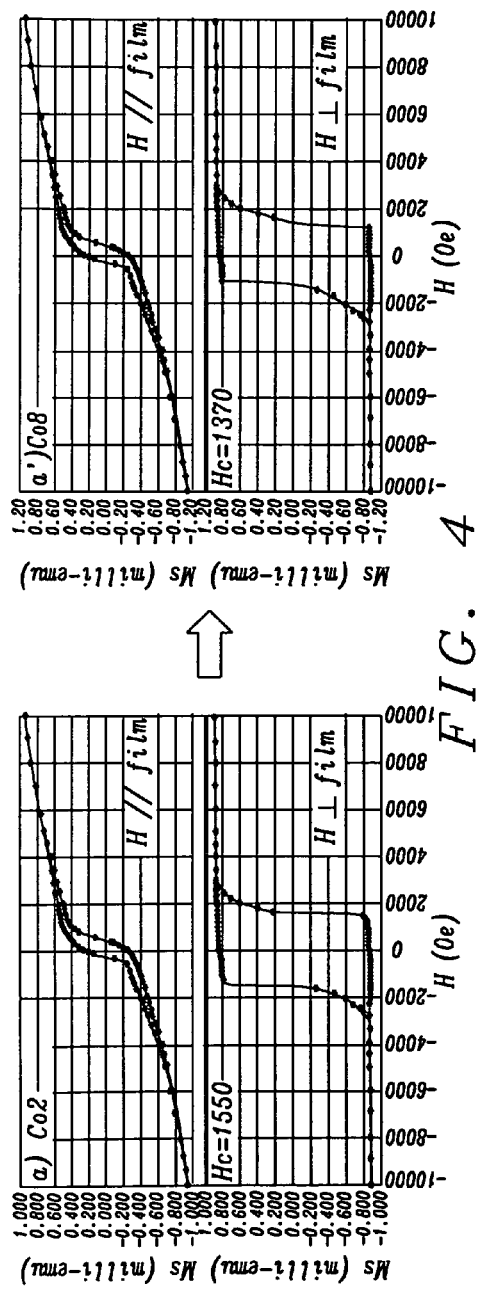
FIG. 4 depicts MH curves showing the effect on PMA when a Co interfacial layer thickness is increased in an embodiment with a top SIL and a Cu spacer.
Figure 5:
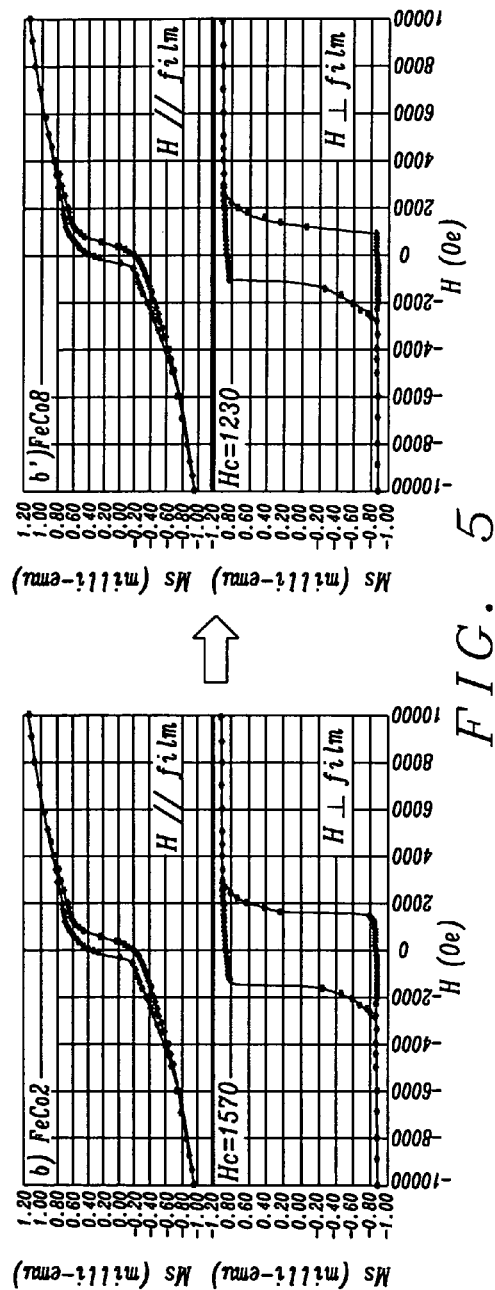
FIG. 5 depicts MH curves showing the effect on PMA when a FeCo interfacial layer thickness is increased in an embodiment with a top SIL and a Cu spacer.

Referring to FIG. 4, a series of STO structures comprising a top SIL configuration were fabricated to demonstrate the efficiency of different thicknesses of a Co interfacial layer as examples of a second embodiment. The top SIL configuration represented by Ta10/Ru20/Cu20/FeCo100/Cu30/Co2/Ni5/[Co2/Ni5]$_{19}$/Ru150 in graph (a) serves as a reference. In graph (a'), a Co8 interfacial layer is employed according to one embodiment of the present invention and the top SIL configuration is represented by Ta10/Ru20/Cu20/FeCo100/Cu30/Co6/Co2/Ni5/[Co2/Ni5]$_{19}$/Ru150 where the number following each layer is the thickness in Angstroms. In other words, the Co layer adjacent to the Cu spacer may be increased from 2 to 8 Angstroms. Ta/Ru/Cu is employed as the seed layer, Cu is the non-magnetic spacer, FeCo100 is the FGL, and a Co2/Ni5/(Co2/Ni5)$_{19}$=(Co2/Ni5)$_{20}$ laminate is the SIL. The capping layer is Ru150. Although Hc decreases slightly with the thicker Co interfacial layer adjacent to Cu, dR/R substantially increases which means there is an advantage to employing a thicker interfacial layer of 5 to 50 Angstroms. In FIG. 5 graph (b), the Co2 layer adjacent to Cu in graph (a) is replaced by FeCo2 to provide another top SIL reference configuration represented by Ta10/Ru20/Cu20/FeCo100/Cu30/FeCo2/Ni5/[Co2/Ni5]$_{19}$/Ru150. When the FeCo thickness is increased from 2 to 8 Angstroms as in graph (b'), Hc decreases somewhat but dR/R is increased.

We have described various embodiments of bottom SIL and top SIL configurations in a STO device wherein an interfacial layer made of Co or FeCo is inserted between a SIL and non-magnetic spacer to stabilize the SIL and simultaneously increase dR/R in the device. The insertion layer is maintained within a thickness range of about 5 to 50 Angstroms so as not to significantly decrease PMA within the SIL. The interfacial layer is demonstrated to be effective with SIL laminates having a $(Co/Ni)_X$ composition. A high PMA in the laminates is achieved by a deposition method for Co, and Ni films that preserves the interfaces between adjoining layers and thereby maintains PMA therein to provide improved performance even with a thin seed layer.

While this invention has been particularly shown and described with reference to, the preferred embodiment thereof, it will be understood by those skilled in the art that various changes in form and details may be made without departing from the spirit and scope of this invention.

We claim:

1. A spin transfer oscillator (STO) structure in a spintronic device, comprising:
    (a) a composite seed layer comprising at least a lower Ta layer formed on a substrate and a metal (M1) layer having a fcc(111) or hcp(001) crystal structure contacting the lower Ta layer;
    (b) a laminated spin injection layer (SIL) with substantial perpendicular magnetic anisotropy (PMA) contacting a top surface of the seed layer;
    (c) an interfacial layer comprised of $Fe_{(100-v)}Co_v$ where v is from 5 to 100 atomic % that contacts a top surface of the laminated SIL;
    (d) a non-magnetic spacer that contacts a top surface of the interfacial layer;
    (e) a field generation layer (FGL) formed on the non-magnetic spacer; and
    (f) a capping layer contacting a top surface of the FGL.

2. The STO structure of claim 1 wherein the laminated SIL is $(Co/Ni)_X$ and x is between about 5 and 50.

3. The STO structure of claim 1 wherein the FGL layer is comprised of FeCo or an alloy thereof containing at least one atom selected from Al, Ge, Si, Ga, B, C, Se, and Sn.

4. The STO structure of claim 1 wherein the lower Ta layer has a thickness from about 5 to 100 Angstroms and the metal (M1) layer with fcc(111) or hcp(001) crystal orientation has a thickness between about 10 to 100 Angstroms and is one of Ru, Cu, Au, Ti, or NiCr.

5. The STO structure of claim 1 wherein the composite seed layer is further comprised of a metal layer M2 that is one of Cu, Ti, Pd, W. Rh, Au, or Ag and formed on the M1 layer to give a Ta/M1/M2 configuration in which the lower Ta layer thickness is from about 5 to 100 Angstroms, the M1 layer thickness is between about 10 and 100 Angstroms, the metal M2 layer thickness is from about 1 to 100 Angstroms, and M1 is unequal to M2.

6. The STO structure of claim 1 wherein the interfacial layer has a thickness from about 5 to 50 Angstroms.

7. The STO structure of claim 1 wherein the non-magnetic spacer is comprised of Cu to give a CPP-GMR configuration or is made of AlOx, MgO, TiOx, TiAlOx, MgZnOx, or ZnOx to give a CPP-TMR configuration.

8. The STO structure of claim 1 wherein the substrate is a main pole layer in a write head and a top surface of the capping layer contacts a trailing shield in said write head.

9. A spin transfer oscillator (STO) structure in a spintronic device, comprising:
(a) a composite seed layer comprising at least a lower Ta layer formed on a substrate and a metal (M1) layer having a fcc(111) or hcp(001) crystal structure contacting the lower Ta layer;
(b) a field generation layer (FGL) formed on the composite seed layer;
(c) a non-magnetic spacer contacting a top surface of the FGL;
(d) an interfacial layer comprised of $Fe_{(100-V)}Co_V$ where v is from 5 to 100 atomic % that contacts a top surface of the non-magnetic spacer;
(e) a laminated spin injection layer (SIL) with substantial perpendicular magnetic anisotropy (PMA) contacting a top surface of the interfacial layer; and
(f) a capping layer contacting a top surface of the SIL.

10. The STO structure of claim 9 wherein the laminated SIL is $(Co/Ni)_X$, and x is between about 5 and 50.

11. The STO structure of claim 9 wherein the FGL layer is comprised of FeCo or an alloy thereof containing at least one atom selected from Al, Ge, Si, Ga, B, C, Se, and Sn.

12. The STO structure of claim 9 wherein the lower Ta layer has a thickness from about 5 to 100 Angstroms and the metal (M1) layer with fcc(111) or hcp(001) crystal orientation has a thickness between about 10 to 100 Angstroms and is one of Ru, Cu, Au, Ti, or NiCr.

13. The STO structure of claim 9 wherein the composite seed layer is further comprised of a metal layer M2 that is one of Cu, Ti, Pd, W. Rh, Au, or Ag and formed on the M1 layer to give a Ta/M1/M2 configuration in which the lower Ta layer thickness is from about 5 to 100 Angstroms, the M1 layer thickness is between about 10 and 100 Angstroms, the metal M2 layer thickness is from about 1 to 100 Angstroms, and M1 is unequal to M2.

14. The STO structure of claim 9 wherein the interfacial layer has a thickness from about 5 to 50 Angstroms.

15. The STO structure of claim 9 wherein the non-magnetic spacer is comprised of Cu to give a CPP-GMR configuration or is made of AlOx, MgO, TiOx, TiAlOx, MgZnOx, or ZnOx to give a CPP-TMR configuration.

16. The STO structure of claim 9 wherein the substrate is a main pole layer in a write head and a top surface of the capping layer contacts a trailing shield in said write head.

17. A method of forming a spin transfer oscillator (STO) structure in a spintronic device; comprising:
(a) depositing a composite seed layer having a fcc(111) crystalline lattice structure on a substrate, said composite seed layer comprises at least a lower Ta layer and a metal M1 layer having a fcc(111) or hcp(001) crystal orientation contacting a top surface of the lower Ta layer;
(b) forming a stack of layers on said composite seed layer, said stack of layers comprises:
(1) a $(Co/Ni)_X$ laminated spin injection layer (SIL) where x is from about 5 to 50, and wherein a thickness (t2) of each Ni layer is greater than a thickness (t1) of each Co layer;
(2) a field generation layer;
(3) a non-magnetic spacer formed between said laminated SIL and field generation layer;
(4) an interfacial layer made of $Fe_{(100-V)}Co_V$ where v is from 5 to 100 atomic % formed between said non-magnetic spacer and said SIL; and
(5) an uppermost capping layer.

18. The method of claim 17 further comprised of annealing the STO structure at a temperature of about 150° C. to 300° C. for a period of about 0.5 to 5 hours.

19. The method of claim 17 wherein the field generation layer is made of FeCo or an alloy thereof.

20. The method of claim 17 wherein the laminated SIL is deposited by a DC magnetron sputtering process comprising a deposition power of less than about 200 Watts and an Ar flow rate of greater than about 15 standard cubic centimeters per minute.

21. The method of claim 17 wherein the metal M1 layer is comprised of Ru, Cu, Au, Ti, or NiCr.

22. The method of claim 17 wherein the seed layer is further comprised of a metal M2 layer that is one of Cu, Ti, Pd, W. Rh, Au, or Ag and formed on the metal M1 layer to give a Ta/M1/M2 configuration in which the lower Ta layer thickness is from about 5 to 100 Angstroms, the metal M1 layer thickness is between about 10 and 100 Angstroms, and the metal M2 layer thickness is from about 1 to 100 Angstroms.

23. The method of claim 17 wherein the interfacial layer has a thickness between about 5 and 50 Angstroms.

* * * * *

UNITED STATES PATENT AND TRADEMARK OFFICE
CERTIFICATE OF CORRECTION

PATENT NO.         : 8,488,373 B2
APPLICATION NO.    : 13/200844
DATED              : July 16, 2013
INVENTOR(S)        : Kunliang Zhang et al.

It is certified that error appears in the above-identified patent and that said Letters Patent is hereby corrected as shown below:

On the Title Page

In the Inventors (75), delete fourth Inventor "Soichi Oikawa, Hachioji (JP)" and replace with
-- Soichi Oikawa, Tokyo (JP) --.

Signed and Sealed this
Twenty-fourth Day of September, 2013

Teresa Stanek Rea
*Deputy Director of the United States Patent and Trademark Office*